(12) United States Patent
Chapman et al.

(10) Patent No.: US 10,432,883 B1
(45) Date of Patent: Oct. 1, 2019

(54) BACKSIDE ILLUMINATED GLOBAL SHUTTER PIXELS

(71) Applicant: SEMICONDUCTOR COMPONENTS INDUSTRIES, LLC, Phoenix, AZ (US)

(72) Inventors: Nathan Wayne Chapman, Middleton, ID (US); Swarnal Borthakur, Boise, ID (US); Marc Allen Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/005,887

(22) Filed: Jun. 12, 2018

(51) Int. Cl.
*H04N 5/3745* (2011.01)
*H04N 5/232* (2006.01)
*H01L 27/146* (2006.01)
*H01L 25/16* (2006.01)

(52) U.S. Cl.
CPC ....... *H04N 5/37452* (2013.01); *H01L 25/167* (2013.01); *H01L 27/14609* (2013.01); *H04N 5/23229* (2013.01)

(58) Field of Classification Search
CPC ........... H04N 5/37452; H04N 5/23229; H01L 25/167; H01L 27/14609
See application file for complete search history.

(56) References Cited

U.S. PATENT DOCUMENTS

| | | | |
|---|---|---|---|
| 9,748,298 B2 | 8/2017 | Lenchenkov et al. | |
| 2010/0006908 A1* | 1/2010 | Brady | H01L 27/1463 257/291 |
| 2012/0161213 A1 | 6/2012 | Roy et al. | |
| 2012/0235212 A1 | 9/2012 | Chen et al. | |
| 2013/0334637 A1 | 12/2013 | Wang et al. | |
| 2014/0197301 A1 | 7/2014 | Velichko et al. | |
| 2016/0204150 A1* | 7/2016 | Oh | H01L 27/14623 257/229 |
| 2017/0339355 A1 | 11/2017 | Lenchenkov et al. | |

OTHER PUBLICATIONS

Velichko et al., U.S. Appl. No. 15/974,452, filed May 8, 2018.

* cited by examiner

*Primary Examiner* — Nicholas G Giles
(74) *Attorney, Agent, or Firm* — Treyz Law Group, P.C.; Joseph F. Guihan

(57) ABSTRACT

Global shutter imaging pixels may include a charge storage region that receives charge from a respective photodiode. Global shutter imaging pixels may be formed as frontside illuminated imaging pixels or backside illuminated imaging pixels. Shielding charge storage regions from incident light may be important for image sensor performance. To shield charge storage regions in backside illuminated global shutter imaging pixels, shielding structures may be included over the charge storage region. The shielding structures may include backside trench isolation structures, a metal layer formed in a backside trench between backside trench isolation structures, and frontside deep trench isolation structures. The metal layer may have angled portions that reflect light towards the photodiodes.

20 Claims, 11 Drawing Sheets

BACKSIDE ILLUMINATED GLOBAL SHUTTER PIXELS

BACKGROUND

This relates generally to imaging devices, and more particularly, to image sensors that include backside illuminated global shutter imaging sensor pixels.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Column circuitry is coupled to each pixel column for reading out pixel signals from the image pixels. The column circuitry often implements a correlated double sampling (CDS) procedure, which involves obtaining pixel signals by computing the difference between reset signals sampled during reset operations and image signals sampled following charge transfer operations.

In a configuration that includes frontside illuminated image pixels, a dielectric stack is formed on the front surface of a semiconductor substrate directly on top of the photodiodes. The dielectric stack includes metal routing lines and metal vias formed in dielectric material. Image light passes through the dielectric stack to the photodiodes. In a configuration that includes backside illuminated image pixels, the photodiodes receive image light through the backside of the semiconductor substrate so that the light does not pass through the dielectric stack.

Image sensors can operate using a global shutter or a rolling shutter scheme. In a global shutter, every pixel in the image sensor may simultaneously capture an image, whereas in a rolling shutter each row of pixels may sequentially capture an image. Pixels in an image sensor that operates in global shutter mode may each include a photodiode for detecting incoming light and a separate storage diode for temporarily storing charge. If care is not taken, parasitic light may be scattered or diffracted into the storage diode, lowering the global shutter pixel efficiency and leading to image artifacts such as vertical shading and moving object smear.

To shield the storage diodes from parasitic light, conventional global shutter pixels may be frontside illuminated pixels with shielding layers in the dielectric stack above the storage diodes. However, frontside illuminated pixels may have limited performance compared to backside illuminated pixels.

It would therefore be desirable to provide improved backside illuminated global shutter imaging pixels for image sensors.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
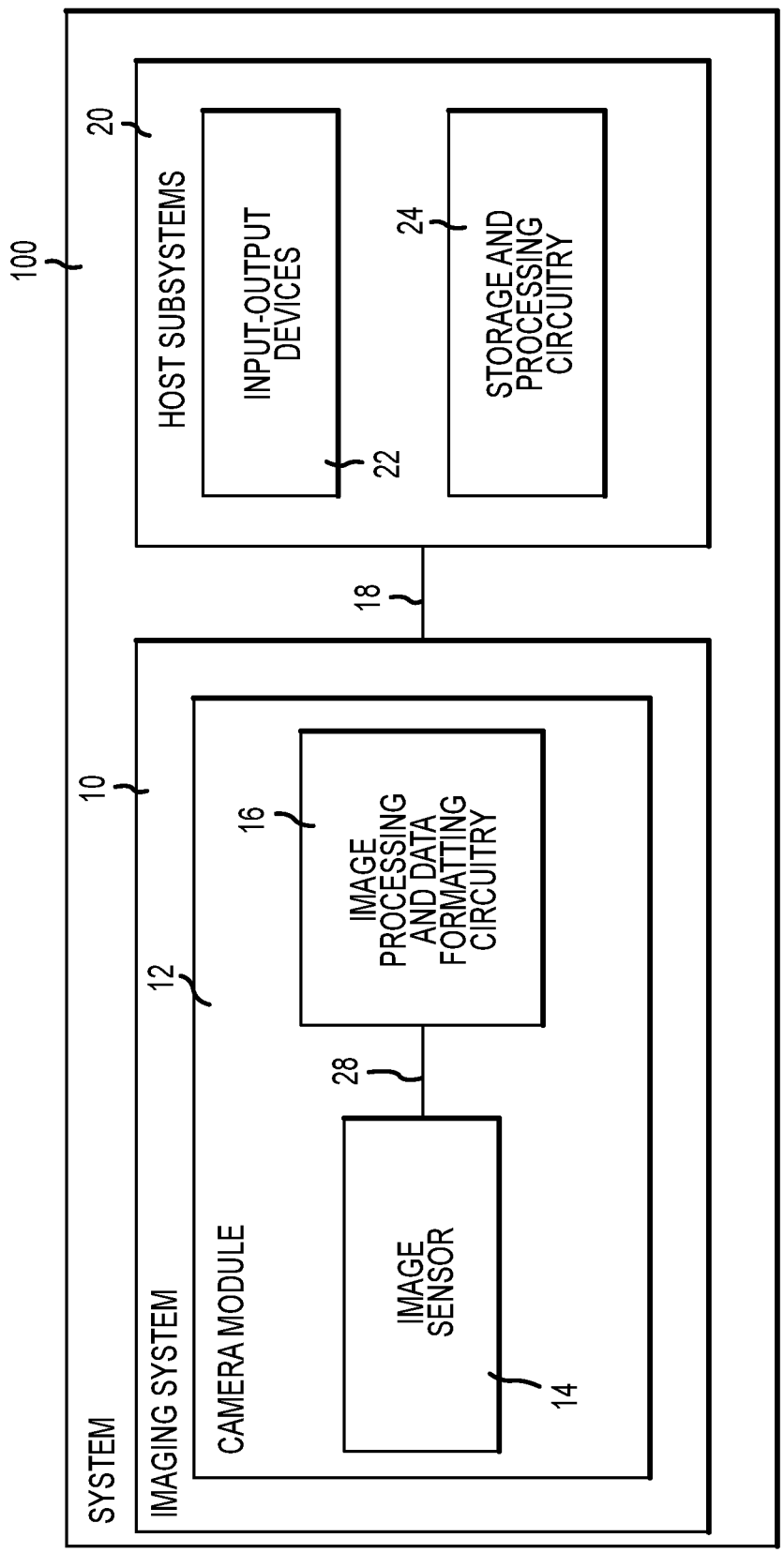
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
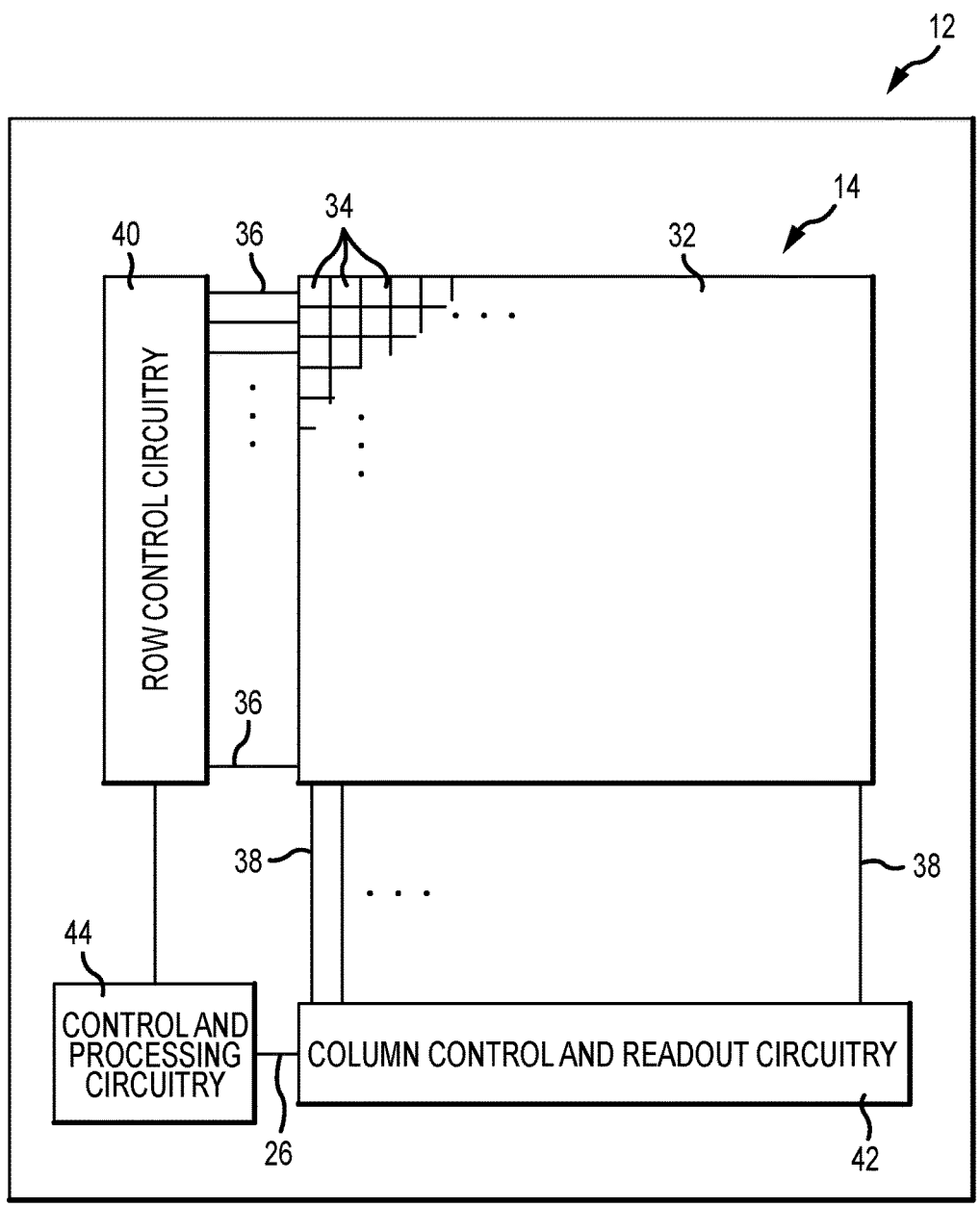
FIG. 2 is a diagram of an illustrative pixel array and associated readout circuitry for reading out image signals in an image sensor in accordance with an embodiment.

An example of an arrangement for camera module 12 of FIG. 1 is shown in FIG. 2. As shown in FIG. 2, camera module 12 includes image sensor 14 and control and processing circuitry 44. Control and processing circuitry 44 may correspond to image processing and data formatting circuitry 16 in FIG. 1. Image sensor 14 may include a pixel array such as array 32 of pixels 34 (sometimes referred to herein as image sensor pixels, imaging pixels, or image pixels 34). Control and processing circuitry 44 may be coupled to row control circuitry 40 and may be coupled to column control and readout circuitry 42 via data path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

If desired, array 32 may be part of a stacked-die arrangement in which pixels 34 of array 32 are split between two or more stacked substrates. In such an arrangement, each of the pixels 34 in the array 32 may be split between the two dies at any desired node within the pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any known metal-to-metal bonding technique, such as soldering or welding.

As mentioned above, the desired node in the pixel circuit that is split across the two dies may be a floating diffusion node. Alternatively, the desired node in the pixel circuit that is split across the two dies may be the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source-follower transistor and a row select transistor, or any other desired node of the pixel circuit.

In general, array 32, row control circuitry 40, column control and readout circuitry 42, and control and processing circuitry 44 may be split between two or more stacked substrates. In one example, array 32 may be formed in a first substrate and row control circuitry 40, column control and readout circuitry 42, and control and processing circuitry 44 may be formed in a second substrate. In another example, array 32 may be split between first and second substrates (using one of the pixel splitting schemes described above) and row control circuitry 40, column control and readout circuitry 42, and control and processing circuitry 44 may be formed in a third substrate.

Figure 3:
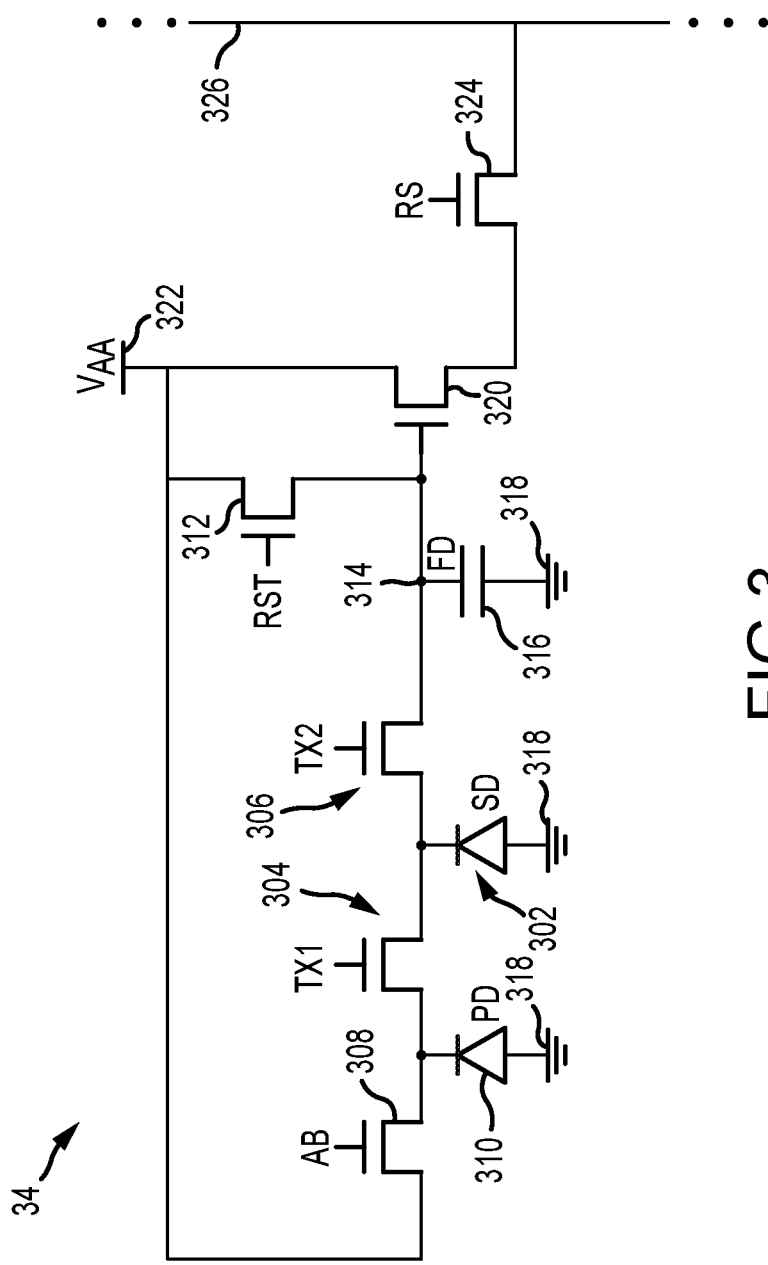
FIG. 3 is a circuit diagram of an image sensor pixel that uses a global shutter method of readout in accordance with an embodiment.

FIG. 3 is a circuit diagram of an image sensor pixel 34 that uses a global shutter method of readout. Image sensor pixel 34 represents a global shutter pixel with pinned photodiode 310 (PD) coupled to a charge storage region 302 (sometimes referred herein to as a storage node). In some embodiments (as in FIG. 3), charge storage region 302 may be a storage diode. Charge storage region 302 may alternatively be a storage gate or other desired type of charge storage region. Anti-blooming transistor 308 may be partially activated using control signal AB in order to draw away dark current that accumulates on photodiode 310. If desired, anti-blooming transistor 308 may be fully activated using control signal AB in order to reset the photodiode.

Impinging light (i.e., incident light) may generate charge in photodiode 310 in a sensor array (e.g., array 32 in FIG. 2). This charge may be transferred to charge storage region 302 globally for all of the pixels at the same time by asserting control signal TX1 and activating transfer transistor 304. The readout of charge from the charge storage region 302 then proceeds in a sequential manner, row by row, by transferring charge via charge transferring transistor 306 to floating diffusion (FD) node 314 by asserting control signal TX2. Floating diffusion node 314 may have a floating diffusion capacitance 316 for storing charge. Photodiode 310, storage diode 302, and floating diffusion capacitance 316 may be coupled to ground 318. Charge transferred to floating diffusion node 314 causes the potential on this node to change and this change is sensed by the source follower transistor 320. A first terminal of source follower transistor 320 is connected via row select transistor 324 to the sensor array column sensing line 326 that delivers the pixel signal to the periphery of the array for further processing. Control signal RS is asserted to activate row select transistor 324 to transfer the pixel signal to column sensing lines 326. After charge sensing has been completed, floating diffusion node 314 is reset to supply voltage $V_{AA}$ by turning on reset transistor 312 by asserting control signal RST. If desired, the charge storage region 302 can be reset at the same time as floating diffusion node 314 by simultaneously asserting both transistors 306 and 312.

The imaging pixel of FIG. 3 may be formed as both a frontside illuminated imaging pixel and a backside illuminated imaging pixel. Shielding charge storage region 302 from incident light (or reflected or scattered light) may be important for image sensor performance. In frontside illuminated imaging pixels, light guides and/or buried light shields may be used to ensure that the charge storage region is sufficiently isolated. However, these types of solutions may not be possible in a backside illuminated imaging pixels. FIGS. 4-11 show different solutions for shielding the charge storage regions in a backside illuminated image sensor.

Figure 4:
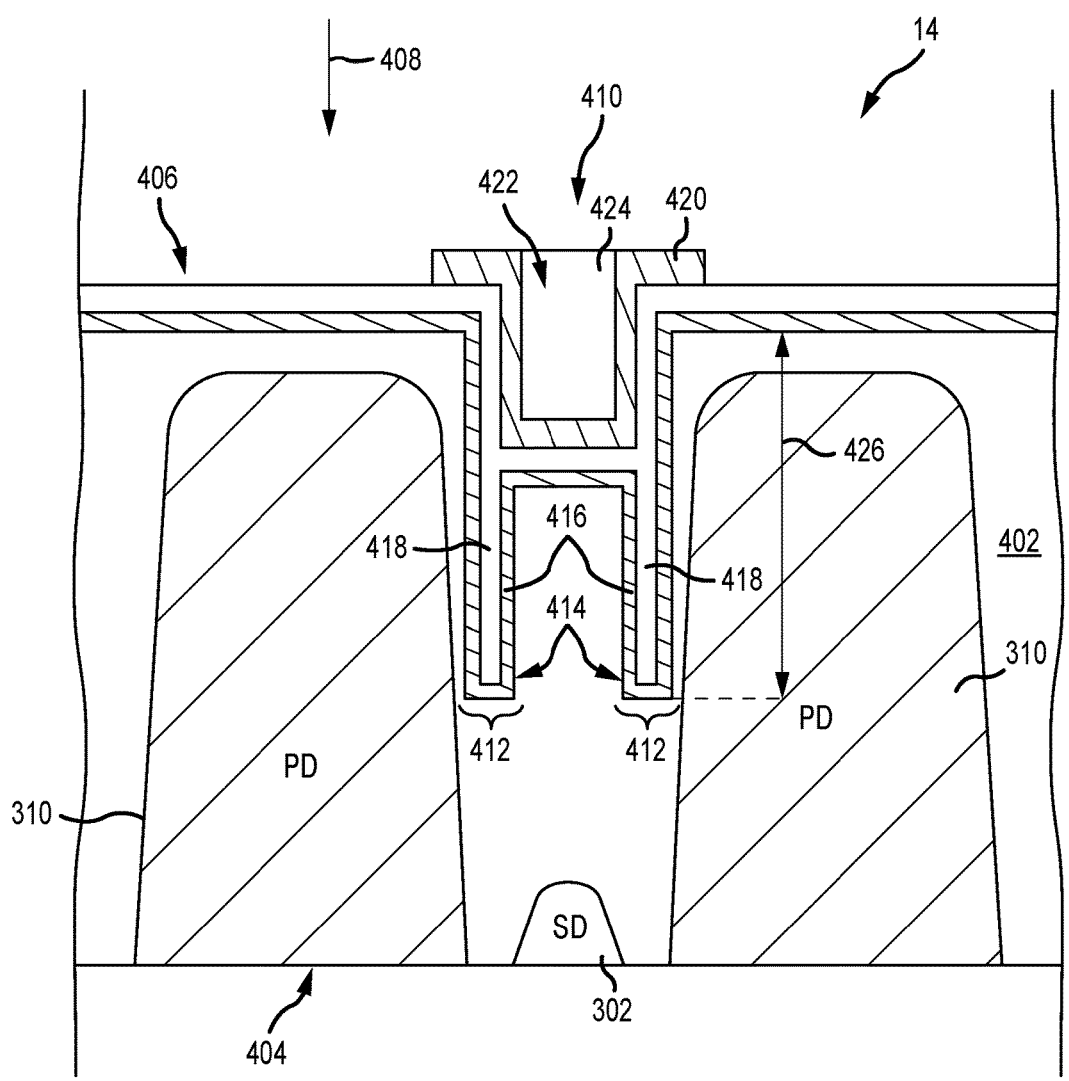
FIG. 4 is a cross-sectional side view of a backside illuminated image sensor with shielding structures including an opaque layer formed in a backside trench between backside trench isolation structures in accordance with an embodiment.

FIG. 4 shows an image sensor that includes photodiodes 310 in substrate 402. Substrate 402 may be a semiconductor substrate (e.g., a p-type doped silicon substrate) and has a front surface 404 and a back surface 406. Each photodiode (PD) 310 is configured to integrate incident light that comes from direction 408 through the back surface of the substrate (e.g., image sensor 14 is backside illuminated).

As shown in FIG. 4, image sensor 14 may include a charge storage region 302 adjacent to a photodiode 310. As previously shown in FIG. 3, each pixel has a transfer transistor that transfers charge from photodiode 310 to charge storage region 302 (although the transfer transistor is not explicitly shown in FIG. 4). The charge storage region may be a storage diode (SD) that is formed at the front surface 404 of substrate 402. Photodiodes 310 and charge storage regions 302 may be formed from doped portions (e.g., n-type doped portions) of the substrate. To shield charge storage region 302 from incident light, image sensor 14 may include shielding structures 410 formed between each adjacent photodiode (over each charge storage region) in the pixel array. Shielding structures 410 may be formed from a number of different structures, including backside deep trench isolation (BDTI), frontside deep trench isolation (FDTI), metal-filled or coated backside trenches, or any other desired structures. Each of FIGS. 4-11 shows a respective arrangement for shielding structures 410 between adjacent photodiodes in the image sensor.

In FIG. 4, shielding structures 410 include first and second backside deep trench isolation structures 412. Backside deep trench isolation structures may be formed by etching trenches 414 into substrate 402 from back surface 406 towards front surface 404. The trench is then filled with material that aids in isolating storage diode 302 from photodiodes 310. For example, in FIG. 4 each backside trench 414 has some combination of an aluminum oxide, hafnium oxide, and tantalum oxide passivation coating. The remainder of each trench is filled with filler material 418 (e.g., silicon dioxide filler material 418). The filler material 418 (e.g., an oxide filler) may have a low index of refraction. If the filler has a low index of refraction (e.g., lower than the surrounding substrate), total internal reflection will help reflect incident light towards photodiode 310 (instead of passing through filler material 418 and reaching storage diode 302).

The above examples of materials filling trenches 414 to form backside deep trench isolation structures 412 are merely illustrative. Backside deep trench isolation structures 412 may have filler 418 formed from silicon dioxide, carbon doped silicon oxide, silicon nitride, silicon oxynitride, or another desired material. Coating 416 (sometimes referred to as a liner) may be formed from a single layer of or a combination of two or more of hafnium oxide, zirconium oxide, tantalum oxide, aluminum oxide, silicon dioxide, or any other desired material. Coating 416 may advantageously have a high dielectric constant. The oxide coating (416) may passivate the exposed silicon surface (e.g., the surface of substrate 402), reducing the generation of dark current in the pixel.

In addition to backside deep trench isolation structures 412, shielding structures 410 in FIG. 4 include an opaque layer 420 that is formed in a respective trench 422 in the back surface of substrate 402. Opaque layer 420 may be opaque to incident light. For example, opaque layer 420 may transmit less than 5% of incident light, less than 1% of incident light, less than 0.1% of incident light, less than 0.01% of incident light, less than 0.001% of incident light, greater than 0.0001% of incident light, etc. Opaque layer 420 may be formed from tungsten, titanium nitride, tantalum nitride, aluminum, copper, or any other desired opaque material. An additional oxide layer 424 (sometimes referred to as filler or a planarization layer) may fill the remainder of trench 422. Oxide layer 424 may have an upper surface that is coplanar with the upper surface of opaque layer 420. Oxide layer 424 may be formed from silicon dioxide or another desired dielectric material.

The example of FIG. 4 of having two backside deep trench isolation structures formed between two adjacent photodiodes is merely illustrative. In an alternate embodiment, a single backside deep trench isolation structure may be formed between two adjacent photodiodes. The single backside deep trench isolation structure may have a width that is larger than the width of each backside deep trench isolation structure shown in FIG. 4. Additionally, the two backside deep trench isolation structures shown in FIG. 4 may actually be part of a single backside deep trench isolation structure that is ring-shaped (e.g., with a square shape, a circular shape, or another desired shape) and that extends around charge storage region 302 when viewed from above. The backside deep trench isolation structures 412 may sometimes be referred to as backside deep trench isolation portions. The backside deep trench isolation portions may be separate portions (e.g., formed from disconnected portions of backside deep trench isolation) or may be portions of a continuous backside deep trench isolation structure.

In FIG. 4 the backside deep trench isolation structures have a length 426 that extends from back surface 406 towards front surface 404. The backside deep trench isolation structures may have any desired length. For example, the backside deep trench isolation structures may extend 60% of the distance to the front surface, between 40% and 60% of the distance to the front surface, between 30% and 70% of the distance to the front surface, between 20% and 80% of the distance to the front surface, greater than 30% of the distance to the front surface, greater than 40% of the distance to the front surface, greater than 50% of the distance to the front surface, greater than 70% of the distance to the front surface, greater than 90% of the distance to the front surface, 100% of the distance to the front surface, etc. In embodiments where the backside deep trench isolation structures extend from the back surface all the way to the front surface (e.g., 100% of the distance between the front and back surfaces), there may be an opening in a portion of the backside deep trench isolation structures around the storage diode to allow charge to be transferred to and from the storage diode.

If desired, opaque layer 420 may be coupled to a bias voltage supply line. The bias voltage supply line may apply a bias voltage to the opaque layer or it may ground the opaque layer. Applying a bias voltage to opaque layer 420 may serve to suppress dark current and improve isolation properties of shielding structures 410. The bias voltage may be applied to another desired layer within shielding structures 410, if desired.

Any desired manufacturing steps may be completed to form the structures of FIG. 4. In one illustrative embodiment, trenches 414 (for the BDTI) may first be formed in substrate 402 (e.g., using etching). Then, etching may be performed to form trench 422 between trenches 414. Trench 422 may merge with trenches 414 in an upper portion of trenches 414, as shown in FIG. 4. Next, coating 416 may be deposited across the image sensor (filling trenches 414 and 422 and covering back surface 406). Filler material 418 (e.g., silicon dioxide) may then be deposited across the image sensor (e.g., filling trenches 414 and 422 and covering back surface 406). Next, opaque layer 420 may be deposited across the image sensor over filler material 418 (filling trench 422 and covering back surface 406). Additional oxide filler 424 may be added to trench 422 over opaque layer 420. Chemical-mechanical planarization may then be performed to planarize the upper surface of opaque layer 420 and oxide filler 424. Finally, opaque layer 420 may be etched (e.g., removing portions of the opaque layer that cover photodiodes 310) to form the structure shown in FIG. 4. These manufacturing steps are merely illustrative and other manufacturing steps may be performed to form the structures of FIG. 4 if desired.

Figure 5:
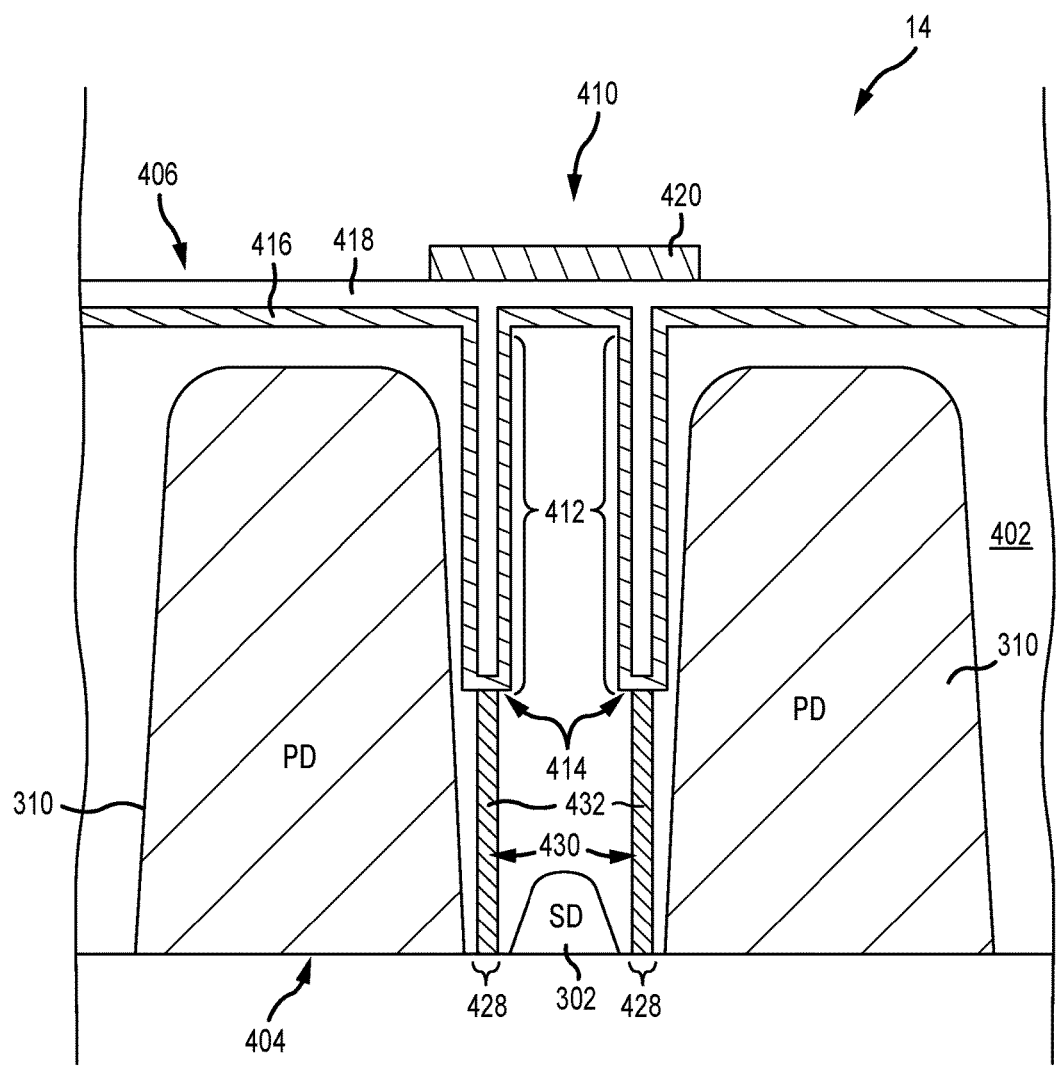
FIG. 5 is a cross-sectional side view of a backside illuminated image sensor with shielding structures including a planar opaque layer formed over backside trench isolation structures and frontside trench isolation structures in accordance with an embodiment.

FIG. 5 shows another possible arrangement for shielding structures 410. In FIG. 5, backside deep trench isolation structures 412 are formed (similar to as in FIG. 4). Each backside deep trench isolation structure has a corresponding trench 414 that is coated with material 416 and filled with filler 418. Filler 418 may be formed from a p-type doped oxide (e.g., boron doped glass) or another oxide material, a p-type doped polysilicon (e.g., boron doped polysilicon), or metal (e.g., tungsten, molybdenum, copper, indium tin oxide or other metals). Coating 416 (sometimes referred to as a liner) may be formed from a p-type doped oxide, phosphorous doped oxide, hafnium oxide, titanium oxide, zirconium oxide, tantalum oxide, aluminum oxide, silicon dioxide, or any other desired material.

In FIG. 5, opaque layer 420 is planar and formed over the planar portion of oxide material 418. Additionally, image sensor 14 in FIG. 5 includes frontside deep trench isolation (FDTI) structures 428. To form frontside deep trench isolation structures 428, trenches 430 are etched into substrate 402 from front surface 404 towards back surface 406. The trench is then filled with material that aids in isolating storage diode 302 from photodiodes 310. For example, trenches 430 may be filled with filler material 432 such as polysilicon. The polysilicon may be doped differently than the silicon substrate 402 or photodiodes 310. Polysilicon 432 in trenches 430 may provide electrical isolation for storage diode 302. Accordingly, there may be an opening in a portion of the frontside deep trench isolation structures around the storage diode to allow charge to be transferred to and from the storage diode.

The example of frontside deep trench isolation structures 428 including polysilicon filler material 432 is merely illustrative. Filler material 432 may be formed from any desired material (e.g., indium tin oxide or another metal material or silicon dioxide or another dielectric material).

In FIG. 5, the trench (430) for frontside deep trench isolation structures 428 meets and merges with the trench (414) for backside deep trench isolation structures 412. Although the trenches merge, the trenches are formed by etching opposite sides of the substrate, may be filled with different filler materials, and may have different widths (and are therefore still considered different trenches). This example is also merely illustrative, and a portion of substrate 402 may be interposed between trenches 414 and 430 (such that trenches 414 and 430 do not meet). In FIG. 5, trenches 414 overlap trenches 430. This example is merely illustrative and trenches 414 and 430 may be non-overlapping if desired. Additionally, the two frontside deep trench isolation structures shown in FIG. 5 may actually be part of a single frontside deep trench isolation structure that is ring-shaped (e.g., with a square shape, a circular shape, or another desired shape) and that extends around charge storage region 302 when viewed from above. The frontside deep trench isolation structures 428 may sometimes be referred to as frontside deep trench isolation portions. The frontside deep trench isolation portions may be separate portions (e.g., formed from disconnected portions of frontside deep trench isolation) or may be portions of a continuous frontside deep trench isolation structure.

Any desired manufacturing steps may be completed to form the structures of FIG. 5. In one illustrative embodiment, trenches 414 (for the BDTI) may first be formed in substrate 402 (e.g., using etching). Then, coating 416 may be deposited across the image sensor (filling trenches 414 and covering back surface 406). Filler material 418 (e.g., silicon dioxide) may then be deposited across the image sensor (e.g., filling trenches 414 and covering back surface 406). Next, opaque layer 420 may be deposited across the image sensor (covering back surface 406) over filler material 418. Finally, opaque layer 420 may be etched (e.g., removing portions of the opaque layer that cover photodiodes 310) to form the structure shown in FIG. 5. Trenches 430 may be etched in front surface 404 and filled with filler 432 to form frontside deep trench isolation structures 428 before or after forming the backside deep trench isolation structures. These manufacturing steps are merely illustrative and other manufacturing steps may be performed to form the structures of FIG. 5 if desired.

If desired, opaque layer 420 may be coupled to a bias voltage supply line. The bias voltage supply line may apply a bias voltage to the opaque layer or it may ground the opaque layer. Applying a bias voltage to opaque layer 420 may serve to suppress dark current and improve isolation properties of shielding structures 410. The bias voltage may be applied to another desired layer within shielding structures 410, if desired.

Figure 6:
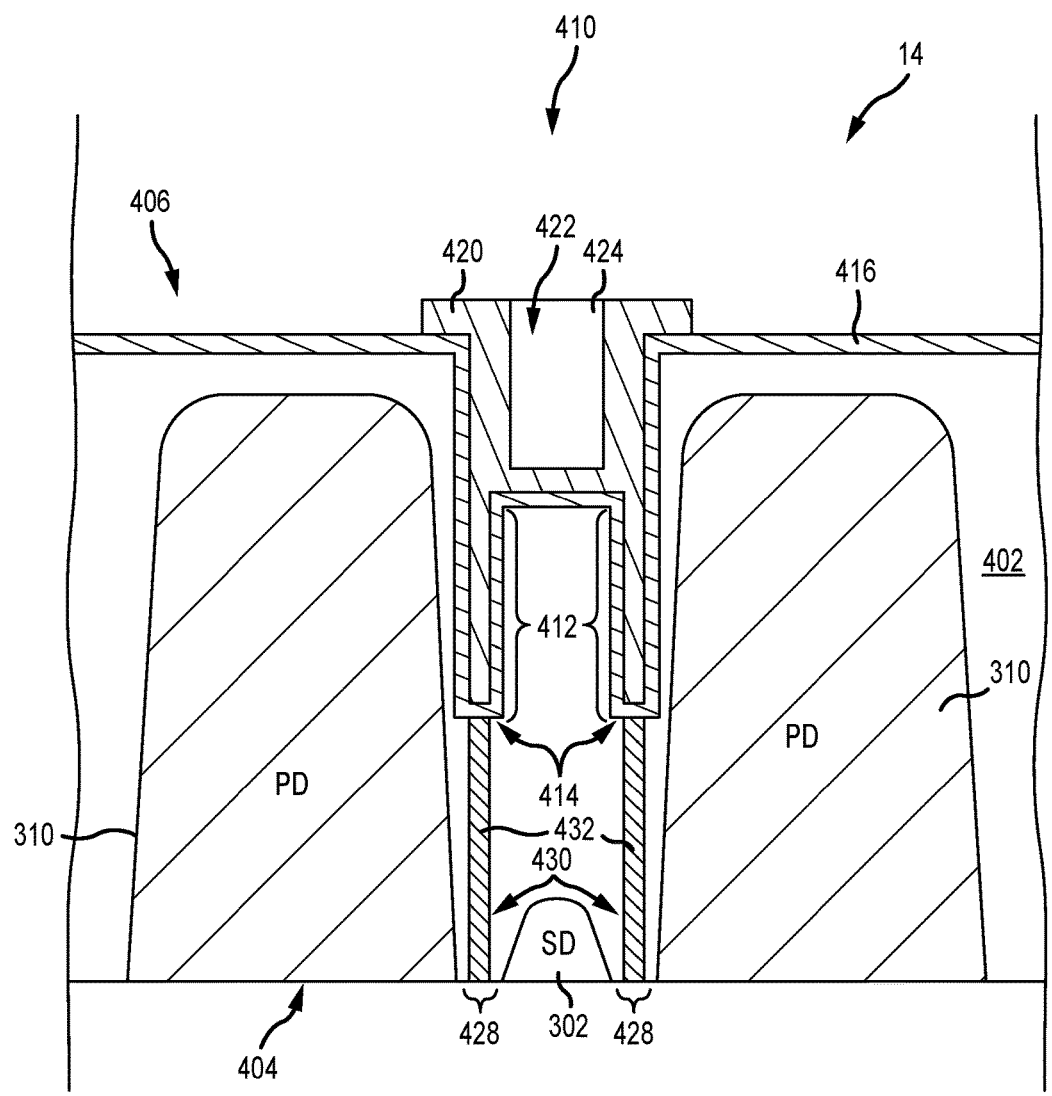
FIG. 6 is a cross-sectional side view of a backside illuminated image sensor with shielding structures including an opaque layer that forms a portion of backside trench isolation structures and fills a backside trench between backside trench isolation structures in accordance with an embodiment.

Yet another embodiment for shielding structures 410 is shown in FIG. 6. As shown in FIG. 6, shielding structures 410 include first and second backside deep trench isolation structures 412, similar to as in FIG. 4. Backside deep trench isolation structures may be formed by etching trenches 414 into substrate 402 from back surface 406 towards front surface 404. The trench is then filled with material that aids in isolating storage diode 302. For example, in FIG. 6 each backside trench 414 has a hafnium oxide and tantalum oxide passivation coating 416. However, in FIG. 4, the trenches were filled with a low index of refraction filler material 418 (e.g., silicon dioxide). In FIG. 6, the trenches may be filled with opaque material that also forms opaque layer 420. For example, opaque layer 420 is formed from a metal such as tungsten that fills trenches 414.

Opaque layer 420 is formed in trench 422 in back surface 406 in addition to trenches 414. Opaque layer 420 may be opaque to incident light. Opaque layer 420 may be formed from tungsten, titanium nitride, tantalum nitride, or any other desired opaque material. An additional oxide layer 424 (sometimes referred to as filler or a planarization layer) may fill the remainder of trench 422. Oxide layer 424 may have an upper surface that is coplanar with the upper surface of opaque layer 420.

The example in FIG. 6 of the same material that fills trenches 414 also filling trench 422 is merely illustrative. If desired, a first metal material may fill trenches 414 and a second, different metal material may fill trench 422.

Additionally, image sensor 14 in FIG. 6 includes frontside deep trench isolation (FDTI) structures 428. To form frontside deep trench isolation structures 428, trenches 430 are etched into substrate 402 from front surface 404 towards back surface 406. The trench is then filled with material that aids in isolating storage diode 302. For example, trenches 430 may be filled with filler material 432 such as polysilicon. The polysilicon may be doped differently than the silicon substrate 402 or photodiodes 310. Polysilicon 432 in trenches 430 may provide electrical isolation for storage diode 302. Accordingly, there may be an opening in a portion of the frontside deep trench isolation structures around the storage diode to allow charge to be transferred to and from the storage diode.

In FIG. 6, the trench (430) for frontside deep trench isolation structures 428 meets and merges with the trench (414) for backside deep trench isolation structures 412. Although the trenches merge, the trenches are formed by etching opposite sides of the substrate, may be filled with different filler materials, and may have different widths (and are therefore still considered different trenches). This example is also merely illustrative, and a portion of substrate 402 may be interposed between trenches 414 and 430. In FIG. 6, trenches 414 overlap trenches 430. This example is merely illustrative and trenches 414 and 430 may be non-overlapping if desired.

Any desired manufacturing steps may be completed to form the structures of FIG. 6. In one illustrative embodiment, trenches 414 (for the BDTI) may first be formed in substrate 402 (e.g., using etching). Then, etching may be performed to form trench 422 between trenches 414. Trench 422 may merge with trenches 414 in an upper portion of trenches 414, as shown in FIG. 6. Next, coating 416 may be deposited across the image sensor (filling trenches 414 and 422 and covering back surface 406). Next, opaque layer 420 may be deposited across the image sensor (filling trenches 414 and 422 and covering back surface 406) over coating 416. Additional oxide filler 424 may be added to trench 422 over opaque layer 420. Chemical-mechanical planarization may then be performed to planarize the upper surface of opaque layer 420 and oxide filler 424. Finally, opaque layer 420 may be etched (e.g., removing portions of the opaque layer that cover photodiodes 310) to form the structure shown in FIG. 6. Trenches 430 may be etched in front surface 404 and filled with filler 432 to form frontside deep trench isolation structures 428 before or after forming the backside deep trench isolation structures. These manufacturing steps are merely illustrative and other manufacturing steps may be performed to form the structures of FIG. 6 if desired.

If desired, opaque layer 420 may be coupled to a bias voltage supply line. The bias voltage supply line may apply a bias voltage to the opaque layer or it may ground the opaque layer. Applying a bias voltage to opaque layer 420 may serve to suppress dark current and improve isolation properties of shielding structures 410. The bias voltage may be applied to another desired layer within shielding structures 410, if desired.

Figure 7:
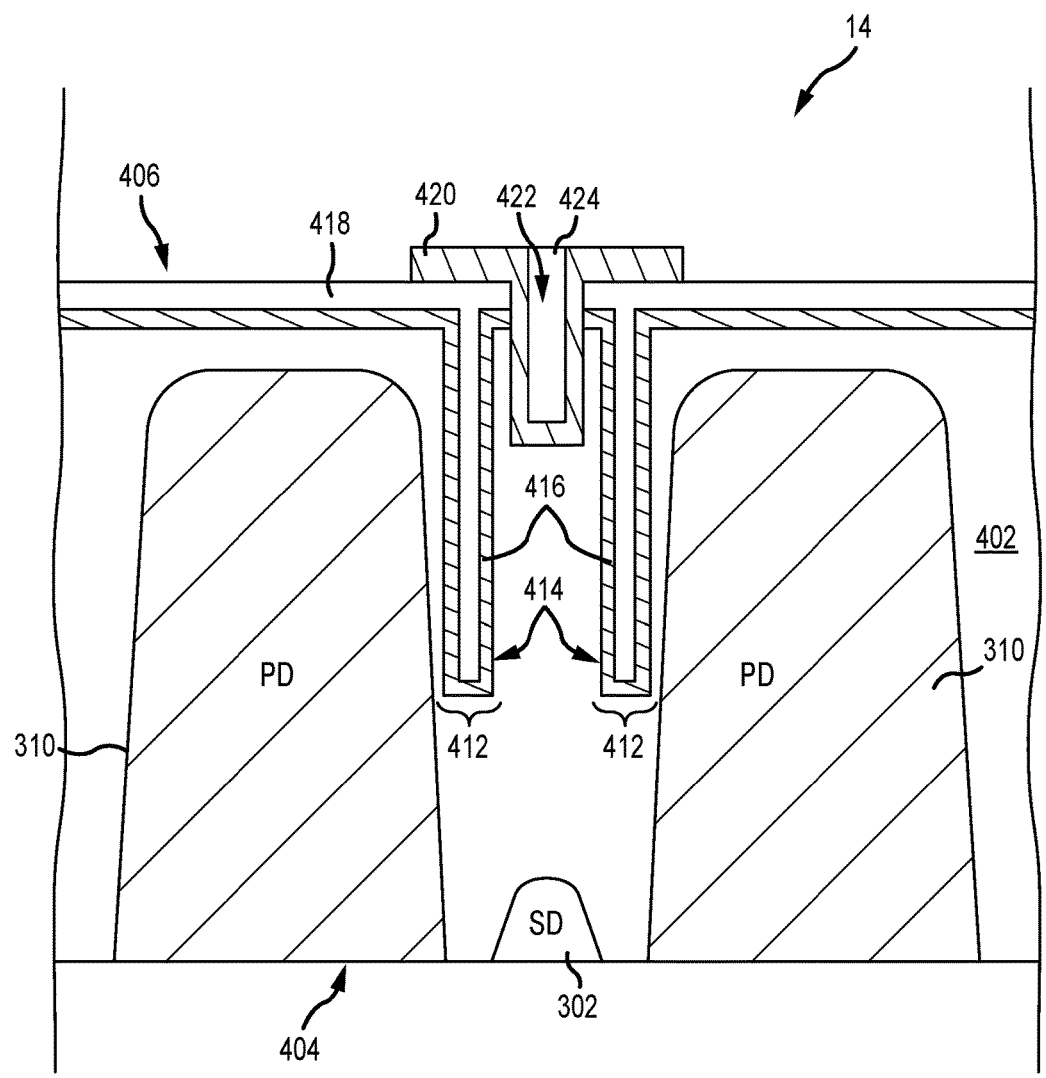
FIG. 7 is a cross-sectional side view of a backside illuminated image sensor with shielding structures including an opaque layer formed in a backside trench that is separated from adjacent backside trench isolation structures in accordance with an embodiment.

In the examples of FIGS. 4-6, trench 422 is merged with an upper portion of trenches 414. This example is merely illustrative. If desired, as shown in FIG. 7, trench 422 may have a width that allows portions of substrate 402 to be interposed between trench 422 and trenches 414 (e.g., the width of trench 422 is less than a distance separating the two trenches 414). Opaque layer 420 may fill trench 422 and may directly contact substrate 402 (as shown in FIG. 7).

Any desired manufacturing steps may be completed to form the structures of FIG. 7. In one illustrative embodiment, trenches 414 (for the BDTI) may first be formed in substrate 402 (e.g., using etching). Next, coating 416 may be deposited across the image sensor (filling trenches 414 and covering back surface 406). Filler material 418 (e.g., silicon dioxide) may then be deposited across the image sensor (e.g., filling trenches 414 and covering back surface 406). Then, etching may be performed to form trench 422 between trenches 414. Trench 422 may have a width that is sufficiently small to ensure that trench 422 does not merge with trenches 414 (e.g., the width of trench 422 is less than a distance separating the two trenches 414). In this embodiment, etching trench 422 may remove portions of coating 416 and filler 418 in addition to substrate 402. Next, opaque layer 420 may be deposited across the image sensor (filling trench 422 and covering back surface 406). Additional oxide filler 424 may be added to trench 422 over opaque layer 420. Chemical-mechanical planarization may then be performed to planarize the upper surface of opaque layer 420 and oxide filler 424. Finally, opaque layer 420 may be etched (e.g., removing portions of the opaque layer that cover photodiodes 310) to form the structure shown in FIG. 7. These manufacturing steps are merely illustrative and other manufacturing steps may be performed to form the structures of FIG. 7 if desired.

If desired, opaque layer 420 may be coupled to a bias voltage supply line. The bias voltage supply line may apply a bias voltage to the opaque layer or it may ground the opaque layer. Applying a bias voltage to opaque layer 420 may serve to suppress dark current and improve isolation properties of shielding structures 410. The bias voltage may be applied to another desired layer within shielding structures 410, if desired.

Figure 8:
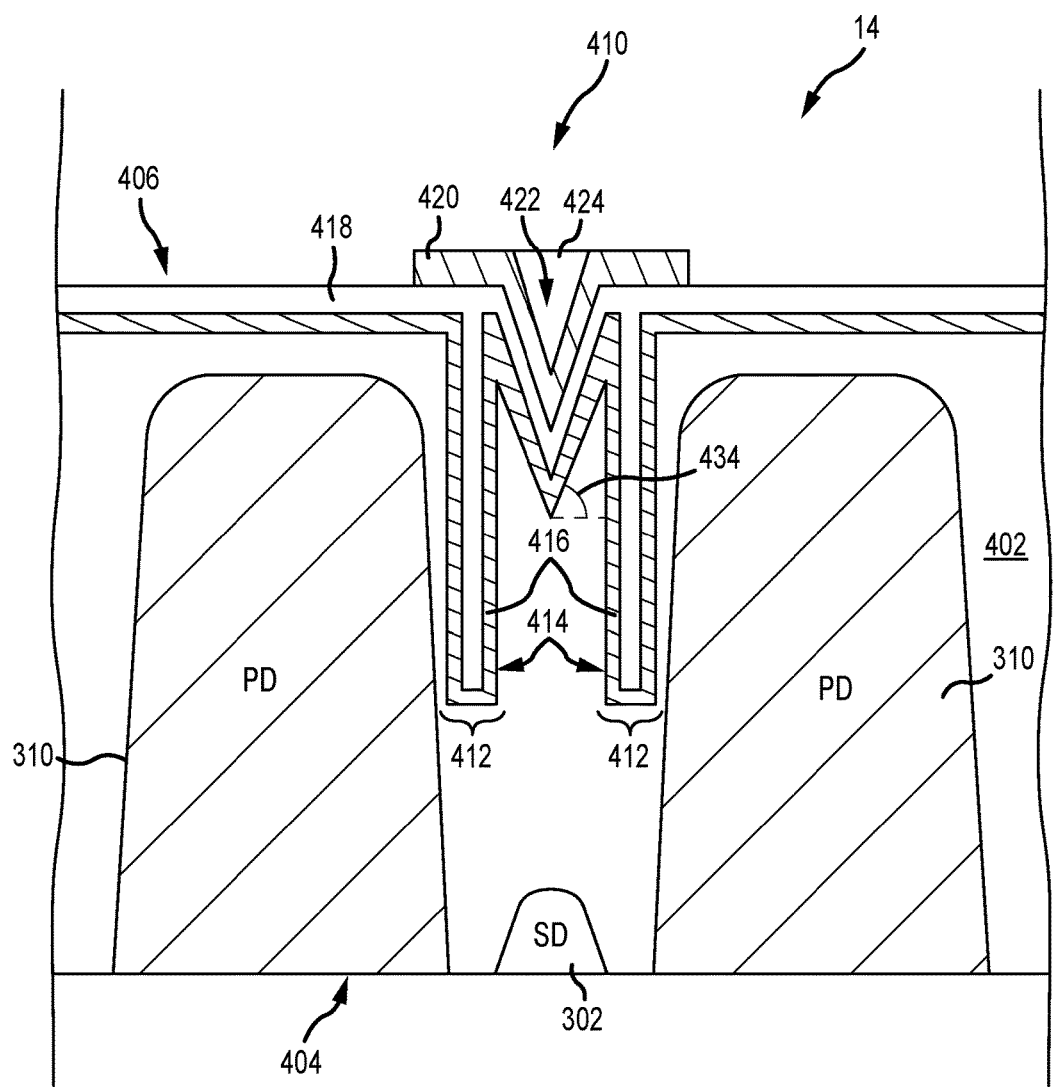
FIG. 8 is a cross-sectional side view of a backside illuminated image sensor with shielding structures including a V-shaped opaque layer formed in a backside trench in accordance with an embodiment.

Yet another embodiment for shielding structures 410 is shown in FIG. 8. As shown in FIG. 8, shielding structures 410 include first and second backside deep trench isolation structures 412, similar to as in FIG. 4. Backside deep trench isolation structures may be formed by etching trenches 414 into substrate 402 from back surface 406 towards front surface 404. The trench is then filled with material that aids in isolating storage diode 302. For example, in FIG. 8 each backside trench 414 has a hafnium oxide passivation coating 416 and a filler material 418 (as previously discussed).

In addition to backside deep trench isolation structures 412, shielding structures 410 in FIG. 8 include an opaque layer 420 that is formed in a respective trench 422 in the back surface of substrate 402. In FIG. 8, trench 422 is formed to have walls at an angle 434 with respect to the X-axis. To form these angled trench walls, trench 422 may be formed using a facet etch. The facet etch may be a wet etch or a dry etch that etches substrate 402 at an angle. The opaque layer that fills trench 422 will accordingly also be at angle 434 relative to the X-axis. The facet etch may be an anisotropic wet etch (e.g., potassium hydroxide) that etches the substrate on the crystalline plane of the substrate. For one illustrative example where substrate 402 is a (100) silicon substrate, the etch angle will be 54.7°. The facet etch may alternatively be an isotropic dry or wet etch that forms a curved surface. In these embodiments, the opaque layer would have first and second curved portions that extend downwards towards the front surface to meet at a vertex below the back surface.

Opaque layer 420 in FIG. 8 has first and second angled portions that extend downwards towards the front surface to meet at a vertex below the back surface. The opaque layer in FIG. 8 may be described as V-shaped. Positioning opaque layer 420 at an angle in this way may help direct more light to photodiodes 310 (e.g., because the opaque layer may reflect more light towards the photodiode and absorb less light in the position of FIG. 8 than when positioned vertically as in FIG. 4). Angle 434 may be equal to any desired angle (e.g., between 54° and 55°, between 50° and 60°, between 45° and 89°, between 52° and 57°, between 35° and 55°, between 35° and 45°, between 35° and 36°, greater than 54°, greater than 50°, greater than 45°, greater than 35°, greater than 30°, less than 89°, less than 70°, less than 55°, etc.). In embodiments where the trench and opaque layer have a curved surface, the angle of the opaque layer relative to the back surface of the substrate varies and may only be equal to angle 434 at one given point along each portion of the opaque layer.

Opaque layer 420 may be opaque to incident light. For example, opaque layer 420 may transmit less than 5% of incident light, less than 1% of incident light, less than 0.1% of incident light, less than 0.01% of incident light, less than 0.001% of incident light, greater than 0.0001% of incident light, etc. Opaque layer 420 may be formed from tungsten, titanium nitride, tantalum nitride, aluminum, copper, or any other desired opaque material. An additional oxide layer 424 (sometimes referred to as filler or a planarization layer) may fill the remainder of trench 422. Oxide layer 424 may have an upper surface that is coplanar with the upper surface of opaque layer 420. Oxide layer 424 may be formed from silicon dioxide or another desired dielectric material.

Any desired manufacturing steps may be completed to form the structures of FIG. 8. In one illustrative embodiment, trenches 414 (for the BDTI) may first be formed in substrate 402 (e.g., using etching). Then, facet etching may be performed to form trench 422 between trenches 414. Trench 422 may be etched to have sidewalls at an angle 434 relative to the X-axis (or curved sidewalls). Next, coating 416 may be deposited across the image sensor (filling trenches 414 and 422 and covering back surface 406). Filler material 418 (e.g., silicon dioxide) may then be deposited across the image sensor (e.g., filling trenches 414 and 422 and covering back surface 406). Next, opaque layer 420 may be deposited across the image sensor (filling trench 422 and covering back surface 406) over filler material 418. Additional oxide filler 424 may be added to trench 422 over opaque layer 420. Chemical-mechanical planarization may then be performed to planarize the upper surface of opaque layer 420 and oxide filler 424. Finally, opaque layer 420 may be etched (e.g., removing portions of the opaque layer that cover photodiodes 310) to form the structure shown in FIG. 8. These manufacturing steps are merely illustrative and other manufacturing steps may be performed to form the structures of FIG. 8 if desired.

Figure 9:
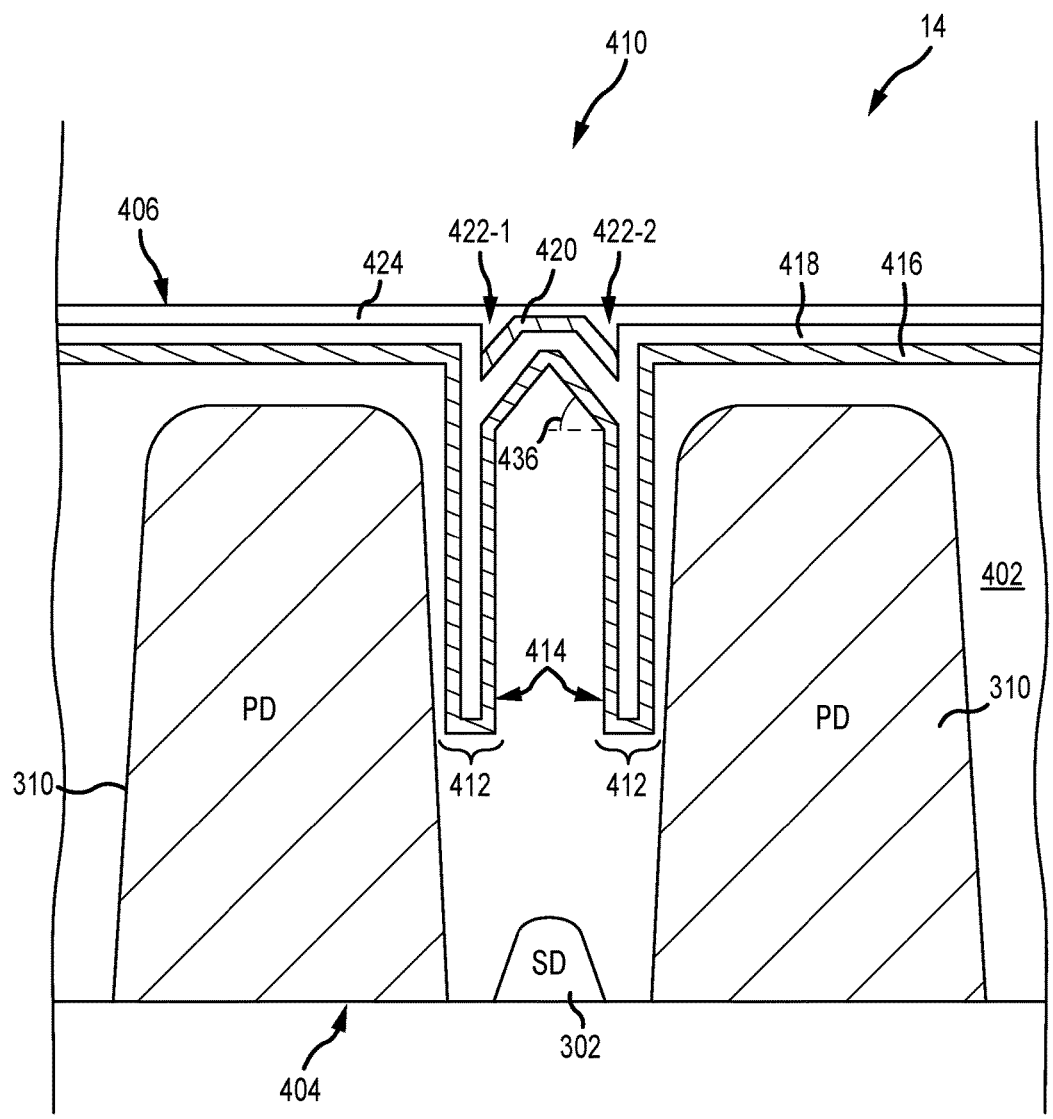
FIG. 9 is a cross-sectional side view of a backside illuminated image sensor with shielding structures including an opaque layer having two angled portions formed in a backside trench in accordance with an embodiment.

FIG. 9 shows a similar embodiment as FIG. 8, with facet etching being used to position opaque layer 420 at an angle. As shown in FIG. 9, shielding structures 410 include first and second backside deep trench isolation structures 412, similar to as in FIG. 8. Backside deep trench isolation structures may be formed by etching trenches 414 into substrate 402 from back surface 406 towards front surface 404. The trench is then filled with material that aids in isolating storage diode 302. For example, in FIG. 9 each backside trench 414 has a hafnium oxide passivation coating 416 and a filler material 418 (as previously discussed).

In addition to backside deep trench isolation structures 412, shielding structures 410 in FIG. 9 include an opaque layer 420 that is formed in trenches 422-1 and 422-2 in the back surface of substrate 402. In FIG. 9, trenches 422-1 and 422-2 are formed to have walls at an angle 436 with respect to the X-axis. To form these angled trench walls, trenches 422-1 and 422-2 may be formed using a facet etch. The facet etch may be a wet etch or a dry etch that etches substrate 402 at an angle. The two trenches may meet to form a vertex or there may be planar portion of substrate 402 between trenches 422-1 and 422-2. The opaque layer 420 has two portions that respectively fill trenches 422-1 and 422-2 and that are at the angle 436 relative to the X-axis. The facet etch may be an anisotropic wet etch (e.g., potassium hydroxide) that etches the substrate on the crystalline plane of the substrate. For one illustrative example where substrate 402 is a (100) silicon substrate, the etch angle will be 54.7°. The facet etch may alternatively be an isotropic dry or wet etch that forms a curved surface. In these embodiments, the opaque layer would have first and second curved portions that extend away from each other and downwards towards the front surface.

Opaque layer 420 may also have a planar portion (e.g., parallel to the X-axis) between the two angled portions (as shown in FIG. 9). Positioning opaque layer 420 at an angle in this way may help direct more light to photodiodes 310 (e.g., because the opaque layer may reflect more light towards the photodiode and absorb less light in the position of FIG. 9 than when positioned vertically as in FIG. 4). Angle 436 may be equal to any desired angle (e.g., between 54° and 55°, between 50° and 60°, between 45° and 89°, between 52° and 57°, between 35° and 55°, between 35° and 45°, between 35° and 36°, greater than 54°, greater than 50°, greater than 45°, greater than 35°, greater than 30°, less than 89°, less than 70°, less than 55°, etc.). In embodiments where the trenches and opaque layer portions have a curved surface, the angle of the opaque layer relative to the back surface of the substrate varies and may only be equal to angle 434 at one given point along each portion of the opaque layer.

An additional oxide layer 424 (sometimes referred to as filler or a planarization layer) may fill the remainder of trenches 422-1 and 422-2. Oxide layer 424 may be formed over the entire image sensor such that it contacts filler material 418 over photodiodes 310. Oxide layer 424 may be formed from silicon dioxide or another desired dielectric material.

Any desired manufacturing steps may be completed to form the structures of FIG. 9. In one illustrative embodiment, trenches 414 (for the BDTI) may first be formed in substrate 402 (e.g., using etching). Then, facet etching may be performed to form trenches 422-1 and 422-2 between trenches 414. Trenches 422-1 and 422-2 may be etched to have sidewalls at an angle 436 relative to the X-axis. Next, coating 416 may be deposited across the image sensor (filling trenches 414, 422-1, and 422-2 and covering back surface 406). Filler material 418 (e.g., silicon dioxide) may then be deposited across the image sensor (e.g., filling trenches 414, 422-1, and 422-2 and covering back surface 406). Next, opaque layer 420 may be deposited across the image sensor (filling trenches 422-1 and 422-2 and covering back surface 406) over filler material 418. Opaque layer 420 may be etched to remove portions of the opaque layer that cover photodiodes 310. Additional oxide filler 424 may be added across the image sensor to fill trenches 422-1 and 422-2 and cover opaque layer 420 to form the structure shown in FIG. 9. These manufacturing steps are merely illustrative and other manufacturing steps may be performed to form the structures of FIG. 9 if desired.

Figure 10:
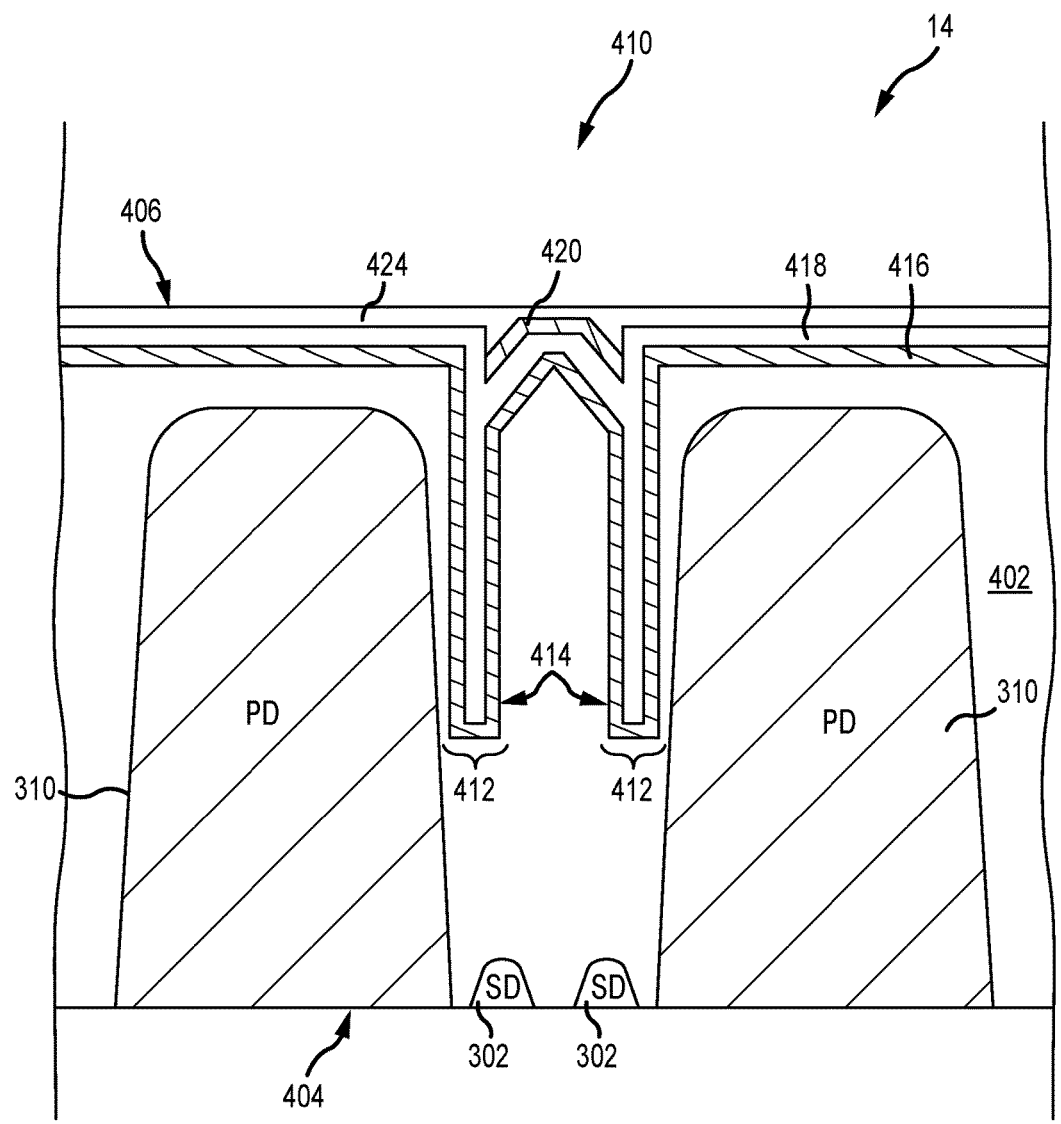
FIG. 10 is a cross-sectional side view of a backside illuminated image sensor with shielding structures that cover two charge storage regions in accordance with an embodiment.

The previous embodiments have all depicted shielding structures 410 as covering one charge storage region 302. This example is merely illustrative. In general, shielding structures 410 between photodiodes 310 may cover any desired number of charge storage regions. FIG. 10 shows shielding structures that are the same as the shielding structures of FIG. 9. However, as shown in FIG. 10, shielding structures 410 cover two charge storage regions 302. This example is merely illustrative. If desired shielding structures 410 may cover one charge storage regions, two charge storage regions, three charge storage regions, four charge storage regions, more than four charge storage regions, etc.

Figure 11:
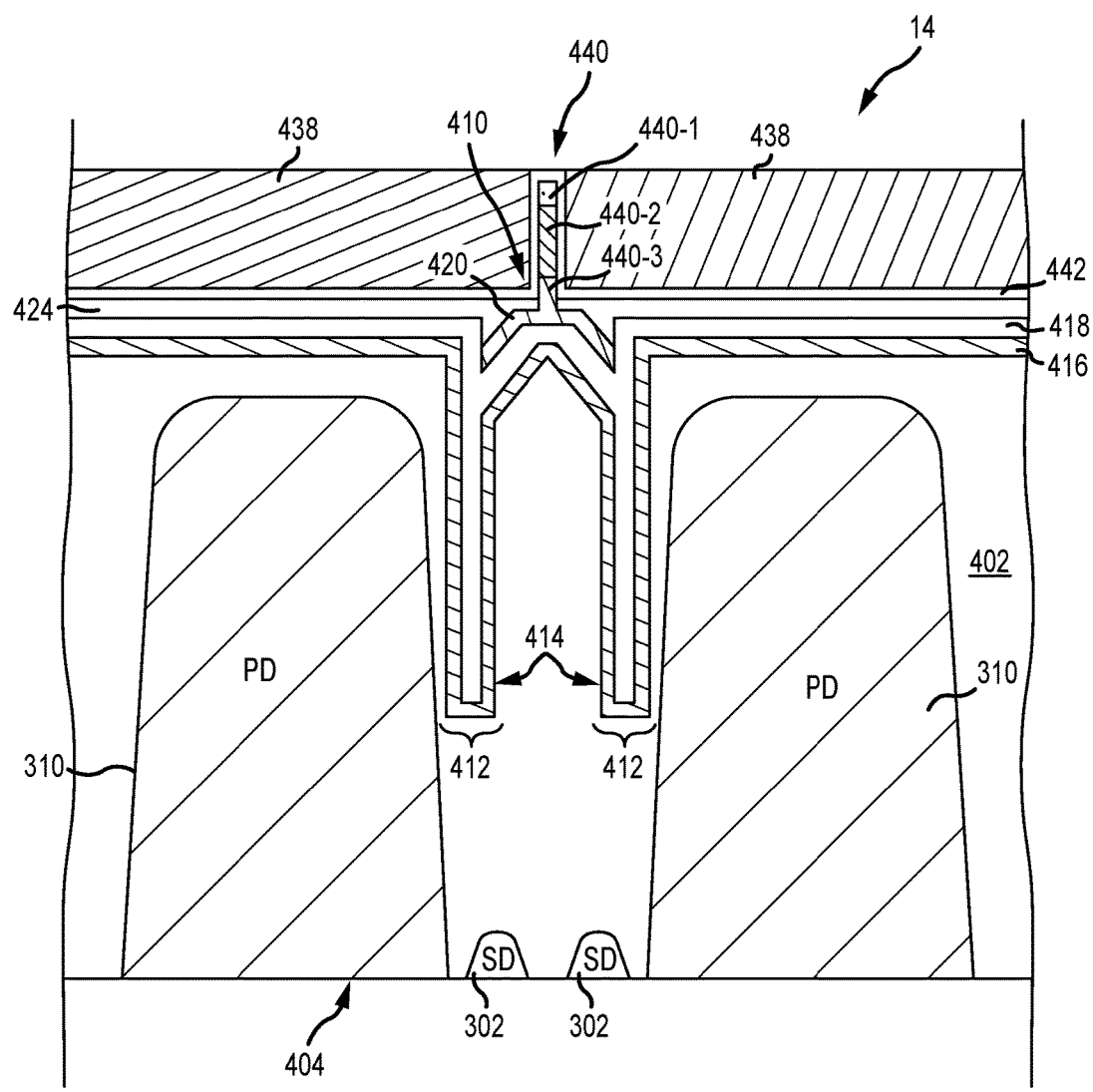
FIG. 11 is a cross-sectional side view of a backside illuminated image sensor with shielding structures that include an opaque layer that also forms a portion of a shielding element between color filter elements in accordance with an embodiment.

Although not explicitly shown in previous embodiments, each photodiode may be covered by a respective color filter element. FIG. 11 shows a respective color filter element 438 formed over each photodiode 310. Each color filter element may pass light of a given color and block light of other colors. In some embodiments, a shielding element 440 may be formed between adjacent color filter elements. The shielding elements 440 may be formed as a grid across image sensor 14 and are therefore sometimes referred to as a composite grid. Each shielding element 440 may be formed from any desired material. Each shielding element 440 may include multiple layers (e.g., 440-1, 440-2, and 440-3) formed from different materials. In general, each shielding element may include any desired number of layers formed from any desired materials. For examples, shielding elements 440 may be formed from tungsten or another desired metal, metal oxide or a composite material. Shielding elements 440 may contain one or more of silicon dioxide, silicon oxynitride, silicon nitride, tantalum, tantalum nitride, titanium, titanium nitride, tungsten, and tungsten nitride. In general, shielding elements 440 may be formed from any desired material or combination of materials. An additional layer 442 (e.g., silicon dioxide or another desired dielectric material) may be interposed between shielding element 440 and the color filter elements if desired.

FIG. 11 has an image sensor with a similar shielding structure as in FIG. 10. As shown in FIG. 11, in embodiments where a composite grid is formed between adjacent color filter elements, the same material may be used to form opaque layer 420 and a layer of the composite grid (e.g., layer 440-3). For example, both opaque layer 420 and layer 440-3 may be formed from tungsten (e.g., opaque layer 420 and layer 440-3 may be formed integrally). Layer 440-3 may extend below the lower surface of the color filter elements 438 to reach the upper surface of the planar portion of opaque layer 420. Said another way, a portion of opaque layer 420 may extend upwards to form a portion of a shielding element between adjacent color filter elements.

The structures and concepts described herein in any of the embodiments of FIGS. 4-11 may be applied to any of the other embodiments in FIGS. 4-11. For example, any of the shielding structures in FIGS. 4-11 may cover one charge storage region (as in FIGS. 4-9), two charge storage regions (as in FIGS. 10 and 11), or more than two charge storage regions. Any of the shielding structures in FIGS. 4-11 may have frontside deep trench isolation structures as shown in FIGS. 5 and 6 or may not have frontside deep trench isolation structures as shown in FIGS. 4 and 7-11. In any of the shielding structures in FIGS. 4-11, the opaque layer 420 may have a portion that extends upward to form a portion of a composite grid (as in FIG. 11). In any of the embodiments of FIGS. 4-11, the opaque layer 420 (or any other desired layer in the shielding structure) may be grounded or coupled to a bias voltage.

In various embodiments, an image sensor may include a substrate having a front surface and a back surface, first and second photodiodes formed in the substrate, a charge storage region formed in the substrate between the first and second photodiodes, backside deep trench isolation having first and second portions between the first and second photodiodes, a trench in between the first and second portions of backside deep trench isolation that extends from the back surface towards the front surface, and an opaque layer formed in the trench.

The opaque layer may include a metal layer. The backside deep trench isolation may include an additional trench that is filled with a filler material. The filler material may include an oxide material. The filler material may include a metal material. The opaque layer may be also formed from the metal material. The backside deep trench isolation may further comprise a passivation coating that is interposed between the filler material and the substrate. The passivation coating may include a material selected from the group consisting of: p-type doped oxide, phosphorous doped oxide, hafnium oxide, titanium oxide, zirconium oxide, tantalum oxide, aluminum oxide, and silicon dioxide. The image sensor may also include a silicon dioxide layer formed over the opaque layer in the trench. The silicon dioxide layer may have an upper surface that is coplanar with an upper surface of the opaque layer.

A width of the trench may be less than a distance between the first and second portions of backside deep trench isolation. The image sensor may also include frontside deep trench isolation having first and second portions between the first and second photodiodes. The first and second portions of frontside deep trench isolation may be respectively overlapped by the first and second portions of backside deep trench isolation. The opaque layer may have at least one portion that is at a non-zero angle relative to the back surface. The image sensor may also include first and second color filter elements formed over the first and second photodiodes and a shielding element interposed between the first and second color filter elements. The opaque layer may have a first portion that forms at least a portion of the shielding element.

In various embodiments, a backside illuminated image sensor may include a substrate having a front surface and a back surface, a photodiode formed in the substrate, a charge storage region that is formed in the substrate and that is configured to receive charge from the photodiode, and shielding structures formed in the substrate over the charge storage region. The shielding structures may include an opaque layer that is formed in a trench between first and second backside deep trench isolation structures. The shielding structures may also include first and second frontside deep trench isolation structures and the first and second backside deep trench isolation structures may overlap the first and second frontside deep trench isolation structures.

In various embodiments, an image sensor may include a substrate having first and second opposing surfaces, first and second photodiodes formed in the substrate, first and second color filters formed over the substrate, the first surface being interposed between the first and second color filters and the second surface, a charge storage region formed in the substrate between the first and second photodiodes, and a metal layer having first and second angled portions formed in at least one trench in the first surface of the substrate. The metal layer may cover the charge storage region. The first and second angled portions may extend away from the first surface and meet at a point below the first surface. The at least one trench may include first and second trenches and the first and second angled portions may be respectively formed in the first and second trenches.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising:
    a substrate having a front surface and a back surface;
    first and second photodiodes formed in the substrate;
    a charge storage region formed in the substrate between the first and second photodiodes;
    backside deep trench isolation having first and second portions between the first and second photodiodes;
    a trench in between the first and second portions of backside deep trench isolation that extends from the back surface towards the front surface;
    an opaque layer formed in the trench; and
    an oxide layer formed over the opaque layer, wherein the oxide layer is formed in the trench.

2. The image sensor defined in claim 1, wherein the opaque layer comprises a metal layer.

3. The image sensor defined in claim 1, wherein the backside deep trench isolation comprises an additional trench that is filled with a filler material.

4. The image sensor defined in claim 3, wherein the filler material comprises an oxide material.

5. The image sensor defined in claim 3, wherein the filler material comprises a metal material.

6. The image sensor defined in claim 3, wherein the backside deep trench isolation further comprises a passivation coating that is interposed between the filler material and the substrate.

7. The image sensor defined in claim 6, wherein the passivation coating comprises a material selected from the group consisting of: p-type doped oxide, phosphorous doped oxide, hafnium oxide, titanium oxide, zirconium oxide, tantalum oxide, aluminum oxide, and silicon dioxide.

8. The image sensor defined in claim 1, wherein the oxide layer is a silicon dioxide layer and wherein the silicon dioxide layer has an upper surface that is coplanar with an upper surface of the opaque layer.

9. The image sensor defined in claim 1, wherein a width of the trench is less than a distance between the first and second portions of backside deep trench isolation.

10. The image sensor defined in claim 1, further comprising:
    frontside deep trench isolation having first and second portions between the first and second photodiodes, wherein the first and second portions of frontside deep trench isolation are respectively overlapped by the first and second portions of backside deep trench isolation.

11. A backside illuminated image sensor comprising:
    a substrate having a front surface and a back surface;
    a photodiode formed in the substrate;
    a charge storage region that is formed in the substrate and that is configured to receive charge from the photodiode;
    shielding structures formed in the substrate over the charge storage region, wherein the shielding structures comprise an opaque layer that is formed in a first trench between first and second backside deep trench isolation structures; and a coating having a first portion formed on the back surface over the photodiode, a second portion formed in a second trench for the first backside deep trench isolation structure, a third portion formed in a third trench for the second backside deep trench isolation structure, and a fourth portion formed in the first trench.

12. The backside illuminated image sensor defined in claim 11, wherein the shielding structures further comprise first and second frontside deep trench isolation structures and wherein the first and second backside deep trench isolation structures overlap the first and second frontside deep trench isolation structures.

13. An image sensor comprising:
a substrate having first and second opposing surfaces;
first and second photodiodes formed in the substrate;
first and second color filters formed over the substrate, wherein the first surface is interposed between the first and second color filters and the second surface;
a charge storage region formed in the substrate between the first and second photodiodes; and
a metal layer having first and second angled portions formed in at least one trench in the first surface of the substrate, wherein the metal layer covers the charge storage region, wherein the first angled portion is at a first angle relative to the first surface, wherein the second angled portion is at a second angle relative to the first surface, wherein the first angle is greater than 0 degrees and less than 90 degrees, and wherein the second angle is greater than 0 degrees and less than 90 degrees.

14. The image sensor defined in claim 13, wherein the first and second angled portions extend away from the first surface and meet directly at a vertex below the first surface.

15. The image sensor defined in claim 13, wherein the at least one trench comprises first and second trenches and wherein the first and second angled portions are respectively formed in the first and second trenches.

16. The image sensor defined in claim 14, wherein metal layer has a horizontal portion that is parallel to the first surface of the substrate and wherein the horizontal portion is interposed between and directly connected to the first and second angled portions.

17. The image sensor defined in claim 1, wherein the oxide layer has a first uppermost surface, wherein the opaque layer has a second uppermost surface, and wherein the first and second uppermost surfaces are coplanar.

18. The image sensor defined in claim 1, wherein the oxide layer has a portion that is formed below a plane defined by the back surface of the substrate, wherein the oxide layer has first and second opposing sides connected by a third side, and wherein the first, second, and third sides of the oxide layer directly contact the opaque layer.

19. The image sensor defined in claim 1, wherein the first portion of backside deep trench isolation comprises a first additional trench that is filled with a first filler material, wherein the second portion of backside deep trench isolation comprises a second additional trench that is filled with a second filler material, wherein the opaque layer has a first portion that is formed in the trench between the first and second portions of backside deep trench isolation, wherein the opaque layer has a second portion that serves as the first filler material for the first portion of backside deep trench isolation, and wherein the opaque layer has a third portion that serves as the second filler material for the second portion of backside deep trench isolation.

20. The backside illuminated image sensor defined in claim 11, wherein the opaque layer has a first portion that is formed in the first trench between the first and second backside deep trench isolation structures, a second portion that extends below the first portion of the opaque layer to form part of the first backside deep trench isolation structure, and a third portion that extends below the first portion of the opaque layer to form part of the second backside deep trench isolation structure.

* * * * *